(12) United States Patent
Pnini-Mittler

(10) Patent No.: US 12,164,234 B2
(45) Date of Patent: Dec. 10, 2024

(54) ACTUATOR DEVICE AND METHOD FOR ALIGNING AN OPTICAL ELEMENT, OPTICAL ASSEMBLY AND PROJECTION EXPOSURE APPARATUS

(71) Applicant: Carl Zeiss SMT GmbH, Oberkochen (DE)

(72) Inventor: Boaz Pnini-Mittler, Goeggingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 666 days.

(21) Appl. No.: 17/458,073

(22) Filed: Aug. 26, 2021

(65) Prior Publication Data

US 2021/0389681 A1 Dec. 16, 2021

Related U.S. Application Data

(63) Continuation of application No. PCT/EP2020/051801, filed on Jan. 24, 2020.

(30) Foreign Application Priority Data

Mar. 4, 2019 (DE) .......................... 102019202868.3

(51) Int. Cl.
*G03F 7/00* (2006.01)
*G02B 7/182* (2021.01)
(52) U.S. Cl.
CPC ....... *G03F 7/70825* (2013.01); *G02B 7/1828* (2013.01); *G03F 7/70258* (2013.01)
(58) Field of Classification Search
CPC ............. G03F 7/70825; G03F 7/70258; G03F 7/70091–70125; G03F 7/70141;
(Continued)

(56) References Cited

U.S. PATENT DOCUMENTS 9,696,518 B2 7/2017 Hembacher
10,254,664 B2 4/2019 Erath
(Continued)

FOREIGN PATENT DOCUMENTS

DE 10 2012 202 170 A1 6/2013
DE 10 2014 224 217 A1 6/2016
(Continued)

OTHER PUBLICATIONS

German Office Action, with translation thereof, for corresponding DE Appl No. 10 2019 202 868.3, dated Oct. 10, 2019.
(Continued)

*Primary Examiner* — Christina A Riddle
(74) *Attorney, Agent, or Firm* — Fish & Richardson P.C.

(57) ABSTRACT

An actuator device aligns an optical element of a projection exposure apparatus. The actuator device includes a shaft. The first end portion of the shaft is deflectably suspended from a base point of a supporting structure by way of a joint. The second end portion of the shaft is fixed on the optical element. At least one actuator unit has a translator fixed on the shaft and a stator mechanically connected to the supporting structure to apply a deflection force to the shaft to radially deflect the shaft from a middle position. A compensation device is set up to apply to the shaft, independently of the deflection force, a compensation force which increases in accordance with the deflection of the shaft from the middle position and which counteracts a restoring force acting on the shaft in the direction of the middle position caused by the weight of the optical element

20 Claims, 6 Drawing Sheets

(58) Field of Classification Search
CPC ... G03F 7/7015–70183; G03F 7/70191; G03F 7/702; G03F 7/70208; G03F 7/70225; G03F 7/70233; G03F 7/70266; G03F 7/70308; G03F 7/70316; G03F 7/708; G03F 7/70808; G03F 7/70833; G03F 7/70841; G03F 7/70975; G03F 7/70883; G03F 7/709; G03F 7/70941; G02B 7/1828; H02K 7/14; H02K 41/0356
USPC .............................. 355/18, 30, 52–55, 67–77
See application file for complete search history.

(56) References Cited

U.S. PATENT DOCUMENTS

2007/0052301 A1* 3/2007 Muehlbeyer ......... G02B 7/1822
　　　　　　　　　　　　　　　　　310/12.01
2009/0185148 A1 7/2009 Kwan et al.
2013/0314681 A1* 11/2013 Erath .................... G02B 7/023
　　　　　　　　　　　　　　　　　359/726

FOREIGN PATENT DOCUMENTS

| DE | 10 2015 225 537 A1 | 6/2017 |
| DE | 10 2017 209 794 A1 | 12/2018 |
| WO | WO 2005/026801 A2 | 3/2005 |
| WO | WO 2005/069055 A2 | 7/2005 |
| WO | WO 2018/224245 A1 | 12/2018 |

OTHER PUBLICATIONS

Translation of International Search Report for corresponding Appl No. PCT/EP2020/051801, dated Jun. 8, 2020.

* cited by examiner

ACTUATOR DEVICE AND METHOD FOR ALIGNING AN OPTICAL ELEMENT, OPTICAL ASSEMBLY AND PROJECTION EXPOSURE APPARATUS

CROSS-REFERENCE TO RELATED APPLICATIONS

The present application is a continuation of, and claims benefit under 35 USC 120 to, international application PCT/EP2020/051801, filed Jan. 24, 2020, which claims benefit under 35 USC 119 of German Application No. 10 2019 202 868.3, filed Mar. 4, 2019. The entire disclosure of these applications are incorporated by reference herein.

FIELD

The disclosure relates to an actuator device for aligning an optical element of a projection exposure apparatus. The disclosure also relates to an optical assembly of a projection exposure apparatus and to a projection exposure apparatus for semiconductor lithography with an illumination system with a radiation source and an optical unit. The disclosure further relates to a method for aligning an optical element of a projection exposure apparatus.

BACKGROUND

On account of the advancing miniaturization of semiconductor circuits, the desired properties for resolution and accuracy of projection exposure apparatuses are equally increasing. Correspondingly high desired properties also have to be met by the optical elements used there, which among other things influence the beam path within the projection exposure apparatuses.

In projection exposure apparatuses for semiconductor lithography, a large number of actuators, for example moving coil actuators ("voice coil motors"), are usually used to mechanically adjust or align the optical elements in the illumination system of the projection exposure apparatus.

WO 2005/026801 A2 discloses adjusting or aligning optical elements for EUV ("Extreme Ultraviolet") projection exposure apparatuses, such as mirrors, in several degrees of freedom using controllable movement axes via actuation units in the form of Lorentz actuators. Moving coil actuators may be used for this, a linearly movable actuation unit, a translator, in the form of a magnet being able to be moved by electromagnetic interaction with a coil which is statically mounted on a stator and surrounds the translator. The translator is connected to the optical element to which an executed movement is transferred.

In practice, a moving coil actuator is usually designed as a DC current linear motor. The basic structure provides a translator (the actuating element of the linear motor) which includes a permanent magnet or on which at least one permanent magnet is fastened and which is at least partially enclosed by a coil designed as a stator. Accordingly, the coil is not movably mounted, which can be desirable since a movable coil would can involve a complicated structure due to the device for energizing the coil. Furthermore, it is often desired to dissipate any heat losses that occur at the coil to surrounding assemblies.

In some cases, the maximum deflection force that can be applied by the moving coil actuators to the optical elements can be limited due to installation space limitations and the usually quite difficult thermal dissipation of heat. Furthermore, the maximum stroke of a moving coil actuator is generally limited for dynamic reasons, since rapid control of the alignment is usually desired, for example to compensate for vibrations.

In some cases, known actuator devices having joints with a certain rigidity are sometimes used to deflect the optical elements, which the actuators first overcome. In the case of a suspended arrangement of the optical element, the deflection may be returned to a neutral middle position as a result of gravity. The actuators therefore generally have to work against joint stiffness on the one hand and against the restoring force caused by gravity on the other hand, which can result in a constant flow of energy into the actuators, and consequently undesired heat generation by the actuators, even if an alignment of the optical element is only intended to be statically maintained. Furthermore, the deflection forces that can be applied by the actuators are typically designed to be sufficiently great, which can worsen the dynamics of the actuators, as already mentioned above.

SUMMARY

The present disclosure seeks to provide an actuator device for aligning an optical element of a projection exposure apparatus which, for example, has high efficiency and the dynamics of which are improved.

The present disclosure seeks to provide an optical assembly of a projection exposure apparatus and providing a projection exposure apparatus of which the optical elements can be aligned or adjusted efficiently and with improved dynamics.

The present disclosure seeks to provide a method for aligning an optical element of a projection exposure apparatus which ensures high efficiency and improved dynamics in the alignment of the optical elements.

In an aspect, the disclosure provides an actuator device for aligning an optical element of a projection exposure apparatus. The actuator device includes a shaft. The first end portion of the shaft is deflectably suspended from a base point of a supporting structure by way of a joint. The second end portion of the shaft is fixed on the optical element. At least one actuator unit has a translator fixed on the shaft and a stator mechanically connected to the supporting structure in order to apply a deflection force to the shaft in order to radially deflect the shaft from a middle position. A compensation device is set up to apply to the shaft, independently of the deflection force, a compensation force which increases in accordance with the deflection of the shaft from the middle position and which counteracts a restoring force acting on the shaft in the direction of the middle position caused by the weight of the optical element.

In an aspect, the disclosure provides a projection exposure apparatus for semiconductor lithography with an illumination system with a radiation source and an optical unit. The optical unit has at least one optical element that can be aligned, mounted, adjusted, manipulated and/or deformed with at least one actuator device described herein.

In an aspect, the disclosure provides a method for aligning an optical element of a projection exposure apparatus. The method includes using at least one actuator unit to apply a deflection force via a translator to a shaft, which is deflectably suspended with a first end portion from a base point of a supporting structure by way of a joint. The second end portion of the shaft is fixed on the optical element in order to radially deflect the shaft from a middle position. The method includes using a compensation device to apply to the shaft, independently of the deflection force, a compensation force to counteract a restoring force acting on the shaft in the direction of the middle position caused by the weight of the optical element.

The actuator generally has a shaft, the first end portion of which is deflectably suspended from a base point of a supporting structure by way of a joint and the second end portion of which is fixed on the optical element.

The optical element may be for example a lens or a mirror of a projection exposure apparatus. However, the disclosure is not restricted to this. With the solution according to the disclosure, generally any optical element of a projection exposure apparatus can be aligned.

The term "suspended" means that the second end portion, and consequently the optical element, are closer to a center of the gravitational source, for example the center of the earth, than the first end portion of the shaft. A weight of the optical element consequently acts substantially in the direction from the first end portion of the shaft to the second end portion of the shaft.

The shaft may be suspended with its upper end for example in the manner of a pendulum from the supporting structure, the optical element being fixed on the lower end of the shaft.

The shaft can be a substantially elongated component.

The actuator device can have at least one actuator unit, with a translator fixed on the shaft and a stator mechanically connected to the supporting structure. The actuator device is designed to apply a deflection force to the shaft in order to radially deflect the shaft from a middle position.

The longitudinal axis of the shaft optionally can run along the vector of the weight of the optical element when the shaft is in the middle position.

According to the disclosure, the actuator device can have a compensation device, which is set up to apply to the shaft independently of the deflection force a compensation force, which increases in accordance with the deflection of the shaft from the middle position and counteracts a restoring force acting on the shaft in the direction of the middle position caused by the weight of the optical element.

According to the disclosure, a negative stiffness can be introduced into the system. A negative stiffness means a variable direction of the compensation force, which increases with the deflection of the shaft from the middle position.

According to the disclosure, the total force or deflection force to be applied by the at least one actuator unit for aligning the optical element or for deflecting the shaft can be reduced, as a result of which less electrical energy is desired. This also reduces the heat output by the at least one actuator unit.

Furthermore, the at least one actuator unit can be made more compact if the desired maximum deflection force is reduced.

According to the disclosure, the dynamics of the actuator device can also be improved overall, with at the same time a great maximum deflection range.

The compensation device can be set up in order to bring about an at least approximately linear deflection-force/displacement characteristic when the shaft is deflected via the at least one actuator unit.

In some embodiments, the actuator device can have a weight compensation device, the shaft being designed as a translator of the weight compensation device or being connected to the translator of the weight compensation device, and the weight compensation device being set up to at least partially compensate for the weight of the optical element.

The weight compensation device can be designed for weight-free or substantially weight-free mounting of the optical element. While the weight of the optical element along the shaft or the translator of the weight compensation device can be directed downward, i.e. toward the center of the gravitational source, for example the center of the earth, the weight compensation force can be directed in the opposite direction to the weight.

Generally, a weight compensation device has a magnetic device including at least one permanent magnet. For example, magnetic weight compensation devices are known.

By using the weight compensation device, the restoring force acting on the shaft can optionally be further reduced, since the weight of the optical element is at least partially compensated. The dynamics and efficiency of the actuator device can consequently be further improved by using the weight compensation device.

Since the weight of the optical element is primarily absorbed by the weight compensation device, the at least one actuator unit can be made small and compact.

In some embodiments, the joint by way of which the first end portion is deflectably suspended from the base point of the supporting structure is designed as a flexure.

For example, a joint which can allow a pivoting movement of the shaft along a first axis, for example in the manner of a pendulum, may be provided. According to the disclosure, the use of a flexure may be well suited for this. A flexure can allow a relative movement by bending of the corresponding joint component. The stiffness of the joint can consequently correspond to the bending stiffness of the material used.

Generally, however, any joint may be provided, e.g., also a joint in the sense of a kinematic pair, optionally a double joint.

In some embodiments, the actuator device has two actuator units which are fixed with their respective translator on opposite sides of the shaft. According to such embodiments, the "at least one actuator unit" consequently corresponds to the two actuator units.

Two actuator units may for example be fixed on the shaft via their respective translators in such a way that a deflection of the shaft can be caused by one of the actuator units exerting a pushing linear movement on the shaft via its translator, whereas the other actuator unit exerts a pulling movement on the shaft via its translator. The desired deflection force can consequently be divided between the actuator units, which may be desirable with regard to the dynamics and the heat distribution in the actuator device.

An opposing or at least substantially opposing arrangement of the actuator units may be desirable.

Although the use of two actuator units is disclosed, generally only one actuator unit may also be provided for deflecting the shaft. In addition, more than two actuator units may also be provided for deflecting the shaft, for example three actuator units, four actuator units or even more actuator units.

The at least one actuator unit can generally be fixed with its translator on the shaft along any angle. For example, the at least one actuator unit may be oriented such that the translator is oriented orthogonally to the longitudinal axis of the shaft when the shaft is in the middle position. Optionally, however, the translator is aligned at an angle to the longitudinal axis of the shaft when the shaft is in the middle position. For example, the translator of the at least one actuator unit may be oriented at an angle between 10° and 80° (e.g., between 20® and 70°, between 30° and 60°, substantially 45°) relative to the longitudinal axis of the shaft, when the shaft is in its middle position.

The translator of the at least one actuator unit may be fixed on the shaft by way of an articulated connection, for example a flexure connection.

The at least one actuator unit may be fixed on the shaft via a fastening element attached to the shaft. When using a number of actuator units, they may be fixed on a common fastening element.

In some embodiments, the at least one actuator unit with its translator is fixed in the area of the second end portion of the shaft.

Generally, it may be desirable if the at least one actuator unit is fixed as close as possible to the fastening point of the optical element on the second end portion of the shaft in order to utilize the greatest possible lever arm. However, depending on the installation space, it may be envisaged not to fix the translator of the at least one actuator unit directly at the fastening point of the optical element, but rather somewhat further in the direction of the first end portion along the longitudinal axis of the shaft. The translator of the at least one actuator unit is optionally arranged in the lower third of the shaft (with regard to the hanging arrangement of the shaft, any indication in the "downward" direction refers to the side of the shaft facing the center of the earth on which the optical element is fixed).

In some embodiments, the at least one actuator unit is designed as a Lorentz actuator, optionally as a moving coil actuator.

In some embodiments, the compensation device has a magnet arrangement in order to generate the compensation force.

A simple construction of the compensation device is possible via a magnet arrangement.

The magnet arrangement is optionally arranged axially symmetrically in relation to the actuator device or at least to the shaft when the shaft is in its middle position.

The magnet arrangement may have at least one permanent magnet, which interacts with at least one magnetic body in such a way that the compensation force is applied to the shaft in accordance with the deflection of the shaft from the middle position. For example, a number of permanent magnets, which correspondingly interact with at least one magnetic body of the shaft—or vice versa—may be arranged radially around the shaft.

The magnetic body may likewise be a permanent magnet, but also any desired ferromagnetic material, for example a soft-magnetic material, on which a permanent magnet has a magnetically attractive effect.

In some embodiments, the magnet arrangement has at least one ring magnet running around the shaft. At least one radially magnetized ring magnet is optionally provided.

A number of ring magnets which are arranged for example distributed among one another along the longitudinal axis of the shaft may also be provided.

The shaft is optionally made of a ferromagnetic material, for example a soft-magnetic material, on which the at least one ring magnet is able to develop a magnetically attractive effect. For example, the shaft may be made of iron.

The at least one ring magnet that runs around the shaft may also interact with at least one permanent magnet, for example at least one inner ring magnet, which is fixed on the shaft, in order to generate the magnetic compensation force.

Optionally, precisely one ring magnet, which interacts magnetically with a shaft of a soft-magnetic design, is provided.

When the shaft is deflected in any direction, the magnet arrangement, for example the at least one ring magnet, can be used to generate a compensation force on the shaft, which increases in the deflection direction and at the same time weakens in the opposite direction, whereby the compensation force is increased the further the shaft moves out of its neutral middle position.

The at least one ring magnet may generally be positioned in the actuator device at any point along the longitudinal axis of the shaft. By selecting the position, the compensation force on the shaft that occurs in accordance with the deflection of the shaft can be set in advance. It may also be provided that the at least one magnetic ring is arranged adjustably along the longitudinal axis of the shaft, for example in order to subsequently calibrate the actuator device or the compensation device. The at least one ring magnet is optionally arranged in the middle third of the shaft.

In some embodiments, the magnet arrangement is designed and/or positioned such that the shaft does not contact the magnet arrangement in its position deflected to the maximum from the middle position.

Contact of the, for example, soft-magnetic shaft with a permanent magnet of the magnet arrangement can result in a strong holding force of the shaft on the magnet arrangement. If applicable, this situation should be avoided in order that the shaft automatically moves back into the middle position when the actuator units are deactivated or when there is no deflection force. For example, a ring magnet may have a sufficiently large inside diameter to give the shaft sufficient leeway for its deflection.

In some embodiments, the compensation device has a spring arrangement in order to generate the compensation force.

A spring arrangement may also be a possibility for designing the compensation device. Using a spring arrangement, the compensation device may for example be designed purely mechanically. In this way, no magnetic or electromagnetic fields that could possibly lead to undesired crosstalk with other actuator devices or other devices of the projection exposure apparatus are generated.

The functional principle of the spring arrangement may generally correspond to the functional principle of a spring arrangement of a bicycle stand.

The spring arrangement can be arranged radially around the shaft. It may also be provided that the spring arrangement is arranged within the shaft.

It may also be envisaged to combine a magnet arrangement and a spring arrangement within a common compensation device in order to jointly generate the compensation force.

In some embodiments, the spring arrangement has at least one tension spring, the tension spring being fixed with a first end on the supporting structure and with a second end on the shaft, and the tension spring being stretched beyond its relaxed length when the shaft is in the middle position.

The tension spring can be pretensioned.

The tension spring can run over the joint or the pivot point of the shaft between the first end portion of the shaft and the base point.

The fixing point of the second end of the tension spring may be fixed along the longitudinal axis of the shaft for calibrating or setting the compensation force. The fixing point of the second end of the tension spring can be located in the middle third along the longitudinal axis of the shaft.

When the shaft is deflected from its middle position, the length of the tension spring can be reduced with increasing deflection of the shaft from the middle position on account of the fixing point of the first end of the tension spring outside the pivot point of the shaft. Since the tension spring, which is under tension, has a tendency to shorten its length and consequently to assume its relaxed state, the spring force may finally bring about a compensation force according to the disclosure as soon as the shaft is deflected from its middle position by the at least one actuator unit.

In some embodiments, the spring arrangement has at least one compression spring, optionally two compression springs, the at least one compression spring being fixed with a first end on the supporting structure and with a second end on the shaft, the compression spring being compressed with respect to its relaxed length when the shaft is in the middle position.

A deflection of the shaft from its middle position can consequently be supported by an expansion and consequently by the spring force of the compression spring as soon as the shaft is deflected from its middle position.

For example, two, three, four or more compression springs may be arranged uniformly around the shaft and fixed with their first ends on the shaft and fixed with their second ends on the supporting structure.

A tensile and/or compressive stress may therefore be provided in order to generate the compensation force, for example in the direction of the deflection force of the shaft from its middle position, which is increased in accordance with the deflection.

The spring arrangement may have a progressive, linear or degressive force-displacement curve.

A spring arrangement which has a progressive or degressive force-displacement curve may be used to compensate for a non-linear force-displacement curve when the shaft is deflected and optionally to linearize the force-displacement curve.

In some embodiments, the compensation device is set up to partially or completely compensate or overcompensate for the restoring force acting on the shaft via the compensation force.

The disclosure also relates to an optical assembly of a projection exposure apparatus, including three actuator devices according to the preceding and following statements, which are designed and aligned with one another in order to tilt a common optical element, optionally a mirror.

When actuating optical elements (for example mirrors) in optical assemblies of projection exposure apparatuses, for example in EUV lithography optics, ever larger optical elements may have to be moved with at the same time high positioning accuracy. The forces desired for this are often difficult to provide by the actuator units used, for example moving coil actuators. Because of the compensation force generated by the compensation device, this can be avoided for the optical assembly according to the disclosure.

According to the disclosure, a negative stiffness may be introduced in order to reduce the total force to be applied to deflect the optical element.

The disclosure can be used with an EUV projection exposure apparatus or an EUV projection optical unit for aligning a mirror.

The disclosure provides a projection exposure apparatus for semiconductor lithography with an illumination system with a radiation source and an optical unit which has at least one optical element to be aligned, the optical element to be aligned being able to be aligned, mounted, adjusted, manipulated and/or deformed with at least one actuator device according to the preceding and following statements.

The disclosure is suitable generally for a large number of applications, for example to correct imaging errors of a projection exposure apparatus.

The disclosure is suitable for example for use with microlithographic DUV ("Deep Ultraviolet") projection exposure apparatuses and, for example, for use with microlithographic EUV projection exposure apparatuses.

A possible use of the disclosure also relates to immersion lithography.

The disclosure provides a method for aligning an optical element of a projection exposure apparatus, according to which at least one actuator unit applies a deflection force via a translator to a shaft, which is deflectably suspended with a first end portion from a base point of a supporting structure by way of a joint and the second end portion of which is fixed on the optical element in order to radially deflect the shaft from a middle position. It is provided that a compensation device is used, a device which applies to the shaft independently of the deflection force a compensation force, which counteracts a restoring force acting on the shaft in the direction of the middle position caused by the weight of the optical element and increases in accordance with the deflection of the shaft from the middle position.

An actuator device may be used for mounting and/or positioning an optical element, for example a mirror, in a microlithographic projection exposure apparatus, with one or more negative stiffnesses favoring the deflection by passive forces, so that overall the lateral deflection of the shaft from the middle position involves less effort.

The disclosure can also suitable for use with flexures, since for example such joints have generally a tendency to return to their neutral position, and consequently the restoring force can be further increased in addition to the restoring force caused by the weight of the optical element.

Features that have already been described in connection with the actuator device according to the disclosure can of course also be implemented for the optical assembly according to the disclosure, the projection exposure apparatus according to the disclosure and the method according to the disclosure—and vice versa. Furthermore, features that have already been mentioned in connection with the actuator device according to the disclosure can also be understood as relating to the optical assembly according to the disclosure, the projection exposure apparatus according to the disclosure and the method according to the disclosure—and vice versa.

Additionally, reference is made to the fact that terms such as "including", "having" or "with" do not exclude other features or steps. Furthermore, terms such as "a(n)" or "the" which indicate single steps or features do not preclude a plurality of features or steps—and vice versa.

The figures show exemplary embodiments in which individual features of the present disclosure are illustrated in combination with one another. Features of exemplary embodiments are also able to be implemented independently of the other features of the same exemplary embodiment, and may readily be combined accordingly by a person skilled in the art to form further expedient combinations and sub-combinations with features of other exemplary embodiments.

BRIEF DESCRIPTION OF THE DRAWINGS

Exemplary embodiments of the disclosure are described in greater detail below with reference to the drawings. In the drawings, functionally identical elements are provided with the same reference signs. In the drawings.

DESCRIPTION OF EXEMPLARY EMBODIMENTS

Figure 1:
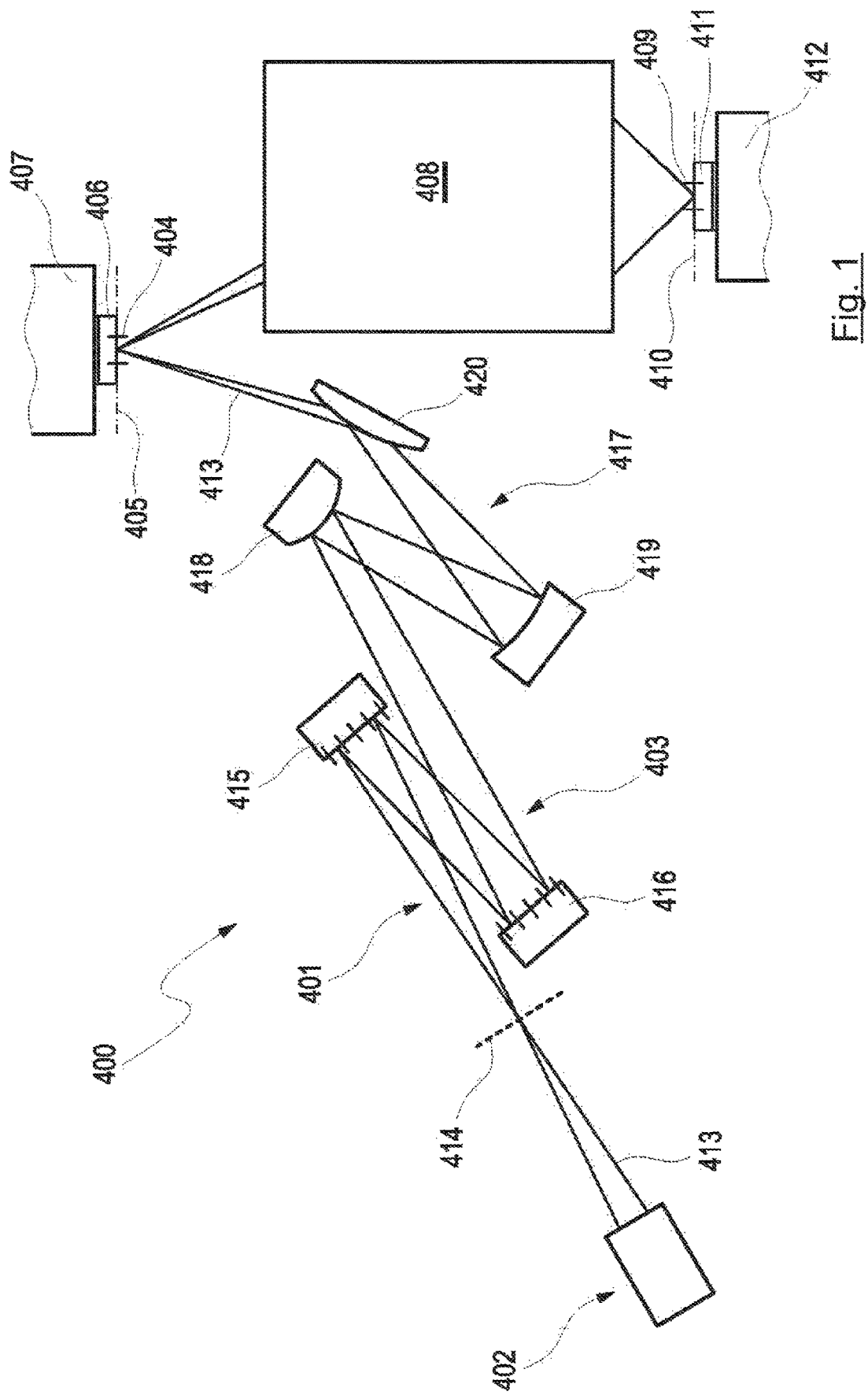
FIG. 1 schematically shows an EUV projection exposure apparatus.

FIG. 1 shows by way of example the basic set-up of an EUV projection exposure apparatus 400 for semiconductor lithography for which the disclosure can find application. An illumination system 401 of the projection exposure apparatus 400 includes, besides a radiation source 402, an optical unit 403 for the illumination of an object field 404 in an object plane 405. A reticle 406 arranged in the object field 404 is illuminated, the reticle being held by a reticle holder 407, illustrated schematically. A projection optical unit 408, illustrated merely schematically, serves for imaging the object field 404 into an image field 409 in an image plane 410. A structure on the reticle 406 is imaged on a light-sensitive layer of a wafer 411 arranged in the region of the image field 409 in the image plane 410, the wafer being held by a wafer holder 412 that is likewise illustrated in part. The radiation source 402 can emit EUV radiation 413, for example in the range of between 5 nanometers and 30 nanometers. Optically differently embodied and mechanically adjustable optical elements 415, 416, 418, 419, 420 are used for controlling the radiation path of the EUV radiation 413. In the case of the EUV projection exposure apparatus 400 illustrated in FIG. 1, the optical elements are embodied as adjustable mirrors in suitable embodiments, which are mentioned merely by way of example below.

The EUV radiation 413 generated via the radiation source 402 is aligned via a collector integrated in the radiation source 402 in such a way that the EUV radiation 413 passes through an intermediate focus in the region of an intermediate focal plane 414 before the EUV radiation 413 impinges on a field facet mirror 415. Downstream of the field facet mirror 415, the EUV radiation 413 is reflected by a pupil facet mirror 416. With the aid of the pupil facet mirror 416 and an optical assembly 417 having mirrors 418, 419, 420, field facets of the field facet mirror 415 are imaged into the object field 404.

Figure 2:
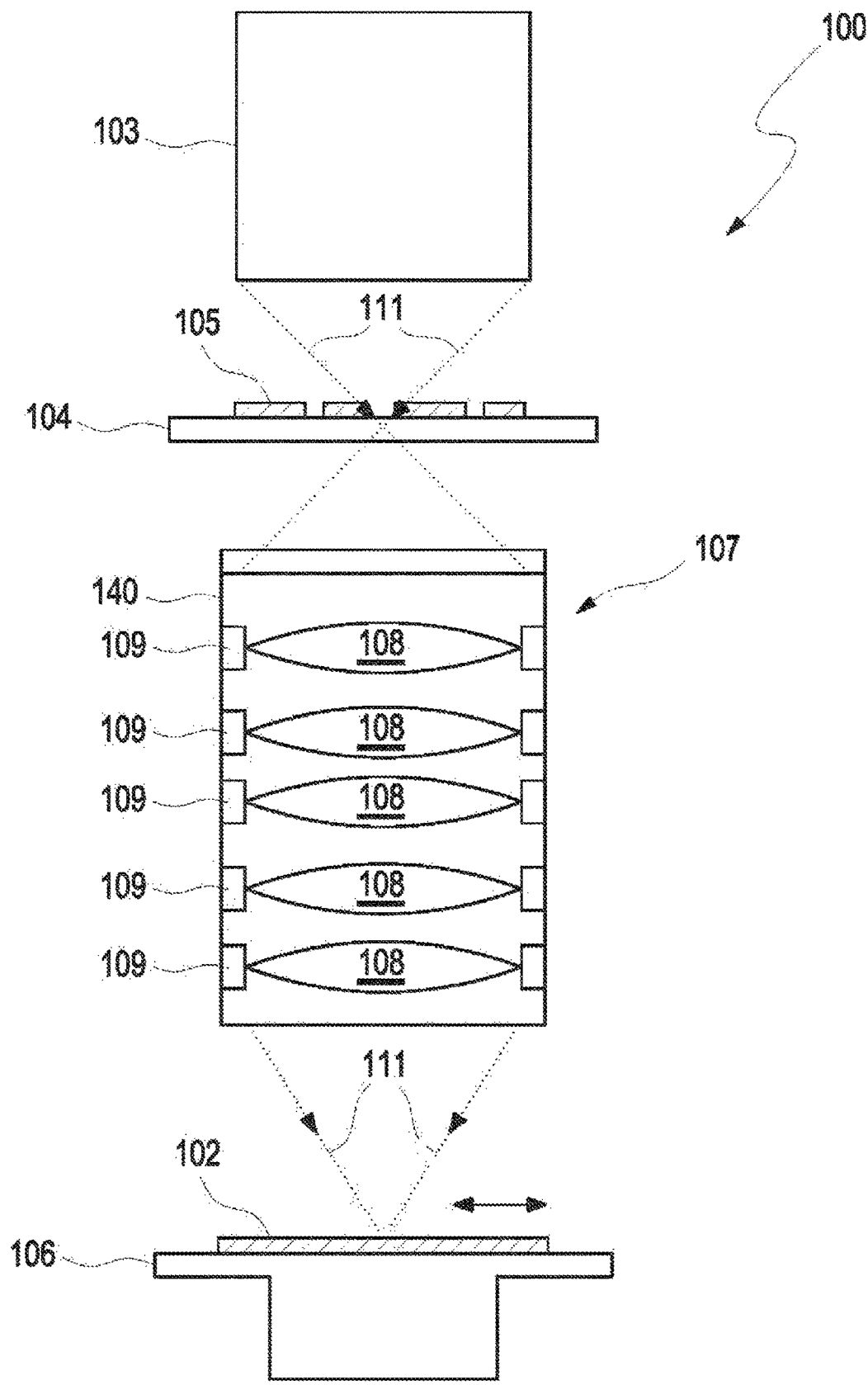
FIG. 2 schematically shows a DUV projection exposure apparatus.

FIG. 2 illustrates an exemplary DUV projection exposure apparatus 100. The projection exposure apparatus 100 includes an illumination system 103, a device known as a reticle stage 104 for receiving and exactly positioning a reticle 105, by which the later structures on a wafer 102 are determined, a wafer holder 106 for holding, moving and exactly positioning the wafer 102 and an imaging device, to be specific a projection lens 107, with a plurality of optical elements 108, which are held by way of mounts 109 in a lens housing 140 of the projection lens 107.

The optical elements 108 may be embodied as individual refractive, diffractive and/or reflective optical elements 108, such as for example lens elements, mirrors, prisms, terminating plates and the like.

The basic functional principle of the projection exposure apparatus 100 provides for the structures introduced into the reticle 105 to be imaged onto the wafer 102.

The illumination system 103 provides a projection beam 111 in the form of electromagnetic radiation, which is desired for the imaging of the reticle 105 on the wafer 102. A laser, a plasma source or the like can be used as the source of this radiation. The radiation is shaped in the illumination system 103 via optical elements such that the projection beam 111 has the desired properties with regard to diameter, polarization, shape of the wavefront and the like when it is incident on the reticle 105.

An image of the reticle 105 is generated via the projection beam 111 and transferred from the projection lens 107 to the wafer 102 in an appropriately reduced form. In this case, the reticle 105 and the wafer 102 can be moved synchronously, so that regions of the reticle 105 are imaged onto corresponding regions of the wafer 102 virtually continuously during a so-called scanning process.

Figure 3:
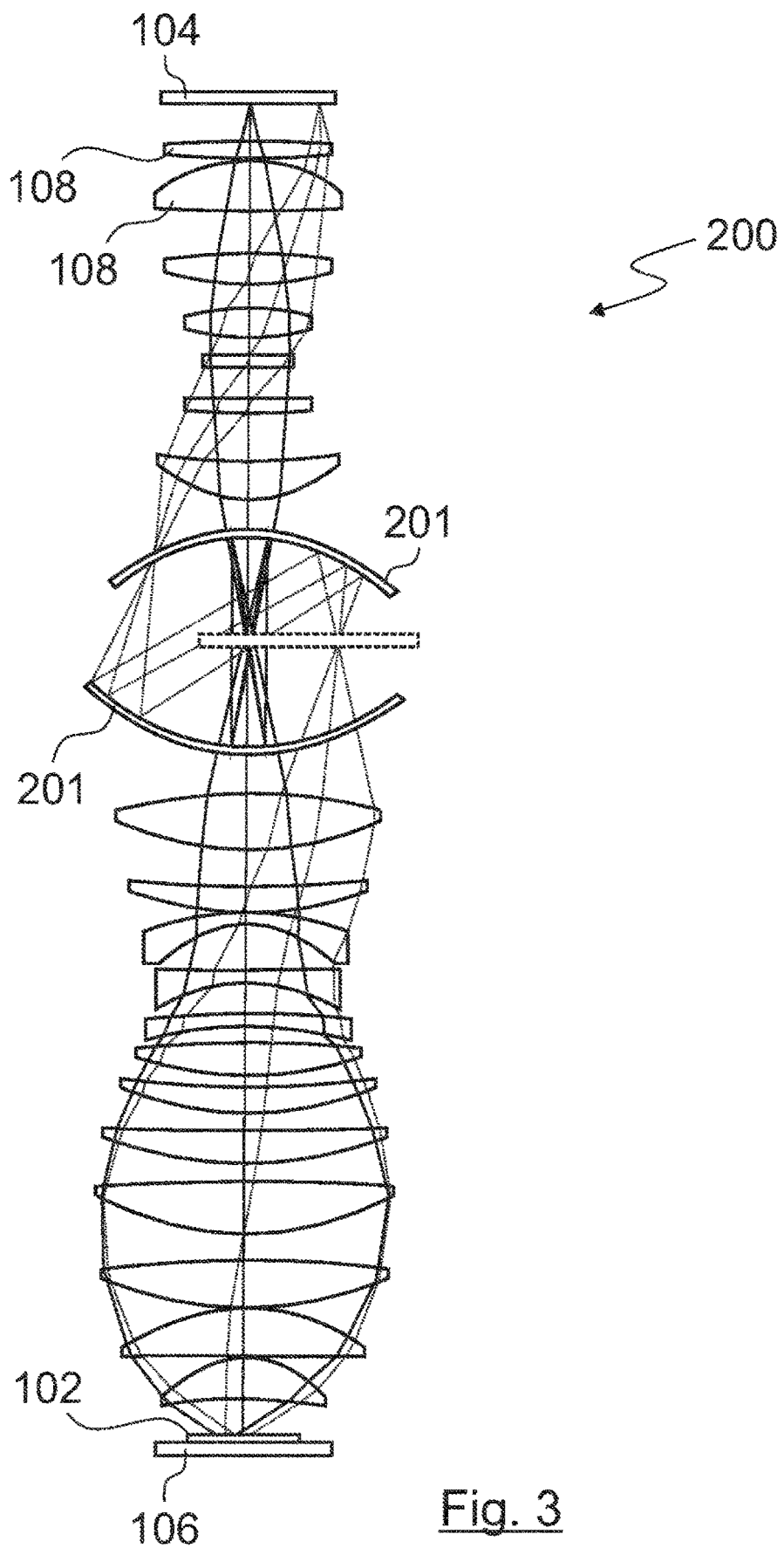
FIG. 3 schematically shows a projection exposure apparatus for immersion lithography.

FIG. 3 illustrates by way of example a third projection exposure apparatus 200 as a DUV projection exposure apparatus for immersion lithography. For further background appertaining to such a projection exposure apparatus 200, reference is made to WO 2005/069055 A2, for example, the content of which is incorporated by reference in the following description. Therefore, the exact functioning will not be discussed in detail at this juncture.

In a manner comparable with the DUV projection exposure apparatus 100 in accordance with FIG. 2, a reticle stage 104 is discernible, by which the later structures on the wafer 102 arranged on the wafer holder 106 or wafer stage are determined. For this purpose, the projection exposure apparatus 200 in FIG. 3 likewise has a plurality of optical elements, for example lens elements 108 and mirrors 201.

The use of the disclosure is not restricted to use in projection exposure apparatuses 100, 200, 400 with the structure described and can generally be used for any projection exposure apparatuses.

The actuator device 3 according to the disclosure, the optical assembly 1 and the method according to the disclosure are suitable generally for aligning any optical elements of any projection exposure apparatus, for example for applications in which the optical elements are intended to be aligned or set with a comparatively great setting range and a comparatively high positioning accuracy and possibly high dynamics.

The disclosure should also not be understood as being restricted to a specific design. The following figures merely show the disclosure by way of example and highly schematically.

Figure 4:
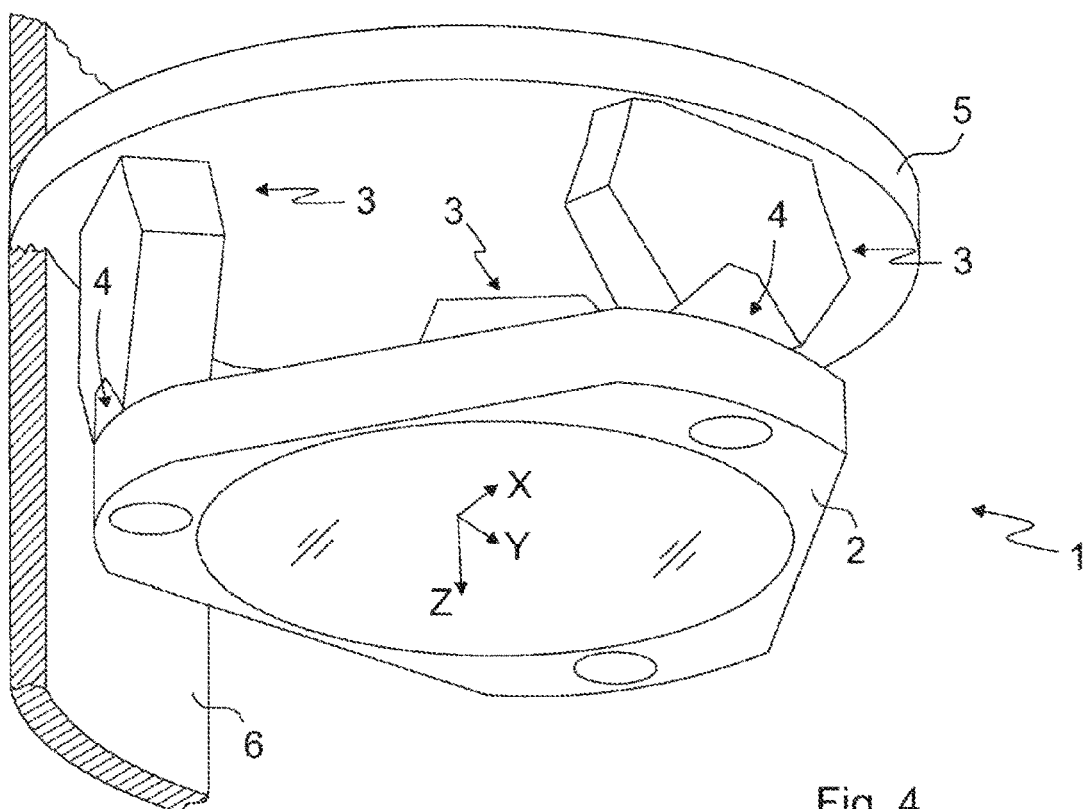
FIG. 4 schematically shows an optical assembly of a projection exposure apparatus, including three actuator devices and an optical element to be aligned in a perspective representation.

FIG. 4 shows an optical assembly 1 of a projection exposure apparatus 100, 200, 400 for aligning an optical element 2. The structure shown in FIG. 4 is suitable for using an actuator device 3 according to the disclosure or a plurality of actuator devices 3 according to the disclosure, in this case three actuator devices 3, for aligning a common optical element 2. It has been found to be suitable to mount and align an optical element 2 with the aid of three actuator devices 3. However, the disclosure is not restricted to a specific number of actuator devices 3.

In the structure according to FIG. 4 it is envisaged to tilt the optical element 2 via the three actuator devices 3 in order to influence the beam path of a projection exposure apparatus 100, 200, 400.

Reference is made to WO 2005/026801 A2 for the further configuration of a basic structure for aligning an optical element 2 that can also be implemented within the scope of the disclosure.

The optical element 2 shown in FIG. 4 may be for example one of the optical elements 415, 416, 418, 419, 420, 108, 201 shown in FIGS. 1, 2 and 3, or a part of the optical elements 415, 416, 418, 419, 420, 108, 201. The solution according to the disclosure is suitable for example for aligning an optical element 2 designed as a mirror.

The actuator devices 3 are connected to the optical element 2 by way of a respective fastening point 4.

By way of the fastening points 4, the optical element 2 can be aligned or set via the actuator device 3 in all axial directions of a coordinate system X, Y, Z, as shown generally in FIG. 4.

FIG. 4 also shows a supporting structure 5, which is connected to a housing part 6 shown only generally.

Figure 5:
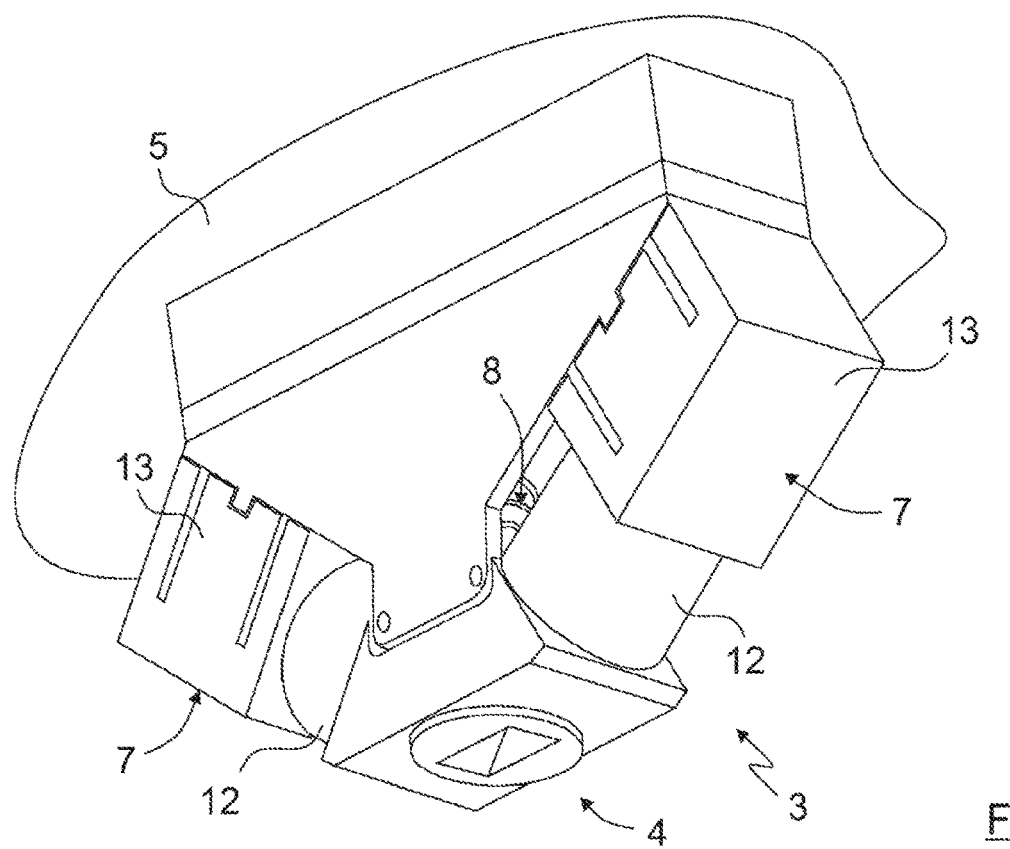
FIG. 5 schematically shows an actuator device for aligning an optical element of a projection exposure apparatus with two actuator units in a perspective representation.

In FIG. 5, a single actuator device 3 is shown by way of example.

The actuator device 3 shown in FIG. 5 for aligning the optical element 2 has two actuator units 7, which are fixed by way of the fastening point 4 on the optical element 2 to be aligned.

In FIGS. 5 to 9, the optical element 2 is not shown for reasons of simplicity of illustration.

Generally, the actuator units 7 may have any desired structure. For example, the actuator units 7 which can be controlled by magnetic forces may be used. For example, Lorentz actuators, and optionally moving coil actuators, may be provided.

Generally, the actuator device 3 may have any number of actuator units 7, for example only one actuator unit 7, three actuator units 7 or more actuator units 7. Two actuator units 7 can be provided, according to a relative alignment with respect to one another shown in FIGS. 5 to 9.

As can be seen from FIG. 5, the two actuator units 7 are designed and set up in such a way that they allow a two-dimensional movement that can be transferred to the optical element 2 by way of the movement point 4. For this purpose, a correspondingly articulated connection may be provided, a connection which is designed as part of the fastening point 4 and is not shown any more specifically. The actuator device 3 shown in FIG. 5 optionally has a weight compensation device 8.

Figure 6:
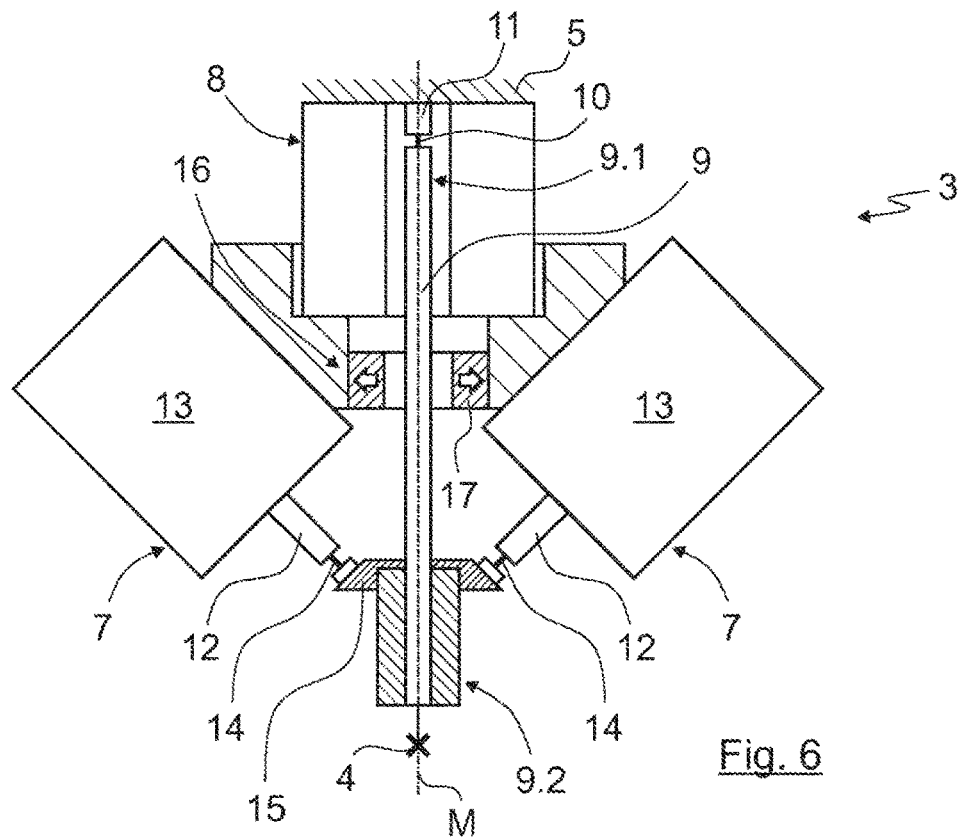
FIG. 6 schematically shows a basic representation of the actuator device of FIG. 5 with a compensation device designed as a magnet arrangement and a shaft located in the middle position.
Figure 7:
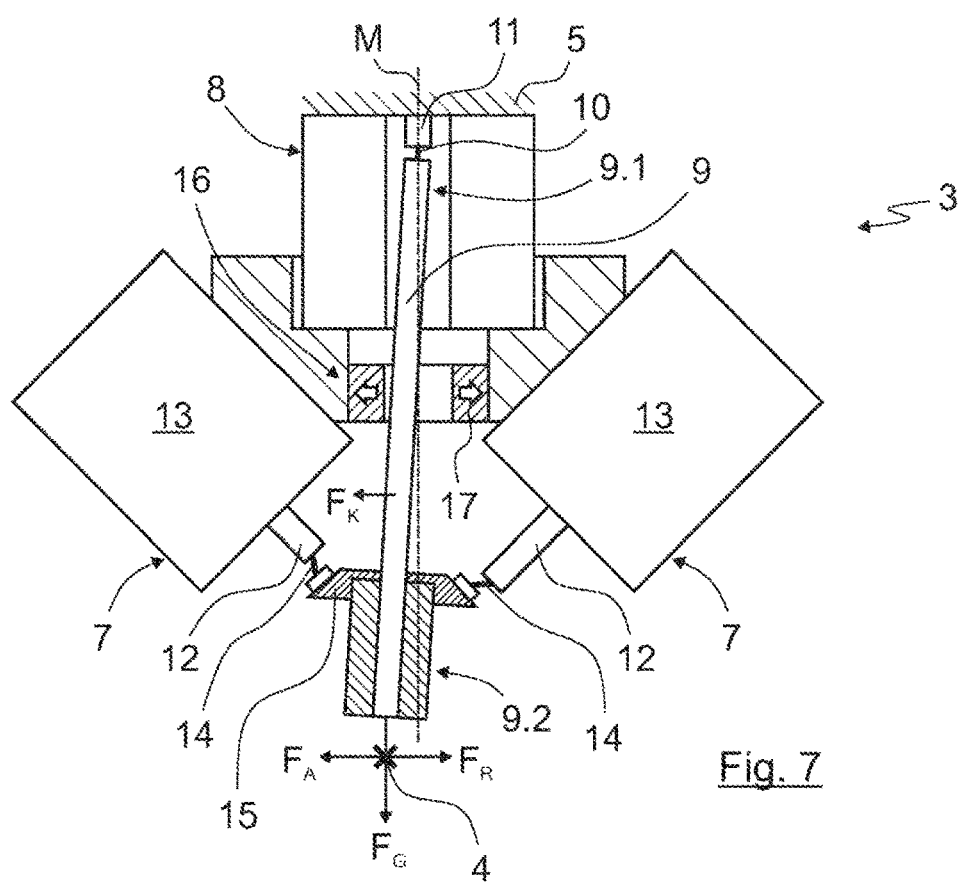
FIG. 7 schematically shows the actuator device of FIG. 6 with a shaft deflected by way of example.

FIGS. 6 and 7 show an actuator device 3 according to the disclosure for aligning the optical element 2 of a projection exposure apparatus 100, 200, 400 in a schematic, partially sectioned representation.

The actuator device 3 has a shaft 9, the first end portion 9.1 of which is deflectably suspended from a base point 11 of the supporting structure 5 by way of a joint 10. The second end portion 9.2 of the shaft 9 is fixed on the optical element 2. The fastening point 4, which may be for example the articulated fastening point 4 shown in FIG. 5, is indicated purely by way of example.

The joint 10 by way of which the first end portion 9.1 of the shaft 9 is deflectably suspended from the supporting structure 5 may be designed as a flexure.

As already indicated above, the actuator device 3 may optionally have a weight compensation device 8, which is only indicated as a black box in FIGS. 6 to 9. The shaft 9 may in this case be designed as a translator of the weight compensation device 8 or be connected to the translator of the weight compensation device 8, the weight compensation device 8 being set up to at least partially compensate for the weight $F_G$ of the optical element 2. Weight compensation devices 8 are known, for example for use with projection exposure apparatuses 100, 200, 400.

The actuator device 3 has at least one actuator unit 7, having a translator 12 fixed on the shaft 9 and a stator 13 mechanically connected to the supporting structure 5 in order to apply a deflection force $F_A$ to the shaft 9 in order to radially deflect the shaft 9 from a middle position M. In FIG. 6, the shaft 9 is shown in the undeflected middle position M, whereas FIG. 7 shows a deflected position of the shaft 9.

As shown in the exemplary embodiment, two actuator units 7 can be provided. The two actuator units 7 are optionally located on opposite sides of the shaft 9 and are correspondingly fixed on the latter with their translator 12.

It may be provided that the at least one actuator unit 7 is oriented at an angle to the shaft 9, as shown in the exemplary embodiments. An alignment of about 45° to the shaft 9 is optionally provided.

The two actuator units 7 are fixed with their translator 12 on a common fastening element 15 of the shaft 9 by way of an articulated connection 14.

The actuator units 7 are fixed in the lower third of the shaft 9. Generally, it may be provided that the at least one actuator unit 7 with its translator 12 is fixed in the area of the second end portion 9.2 of the shaft 9, i.e. as close as possible to the fastening point 4 of the optical element 2 in order to make use of the greatest possible lever arm.

An issue the alignment of the optical element 2 according to certain known approaches is that the weight $F_G$ of the optical element 2 when the shaft 9 is deflected from its middle position M causes a restoring force FR on the shaft 9 in the direction of the middle position M, which exerts an additional load on the at least one actuator unit 7. According to the disclosure, to solve this problem a compensation device 16 is provided, set up to apply to the shaft 9 independently of the deflection force $F_A$ of the at least one actuator unit 7 a compensation force $F_K$, which increases in accordance with the deflection of the shaft 9 from the middle position M and counteracts the restoring force FR. The compensation device 16 can be set up, for example, to partially or completely compensate or even overcompensate for the restoring force FR acting on the shaft 9 by the compensation force $F_K$.

In FIGS. 6 and 7, the compensation device 16 has a magnet arrangement in order to generate the compensation force $F_K$.

The magnet arrangement may have at least one ring magnet 17 running around the shaft 9 or other permanent magnets and parts that can be influenced magnetically. As shown in the exemplary embodiment, a ring magnet 17 running around the shaft 9 is optionally provided. The ring magnet 17 optionally has a radial magnetization (shown in FIGS. 6 and 7 by corresponding arrows). The orientation of the magnetization (N/S or S/N) is generally irrelevant.

The shaft 9 is optionally made of a soft-magnetic material on which the ring magnet 17 has a magnetically attractive effect. When the shaft 9 is deflected from its middle position M, the magnetic force of attraction of the ring magnet 17 on the shaft 9 consequently increases while the shaft 9 approaches the inner wall of the ring magnet 17. As a result, the restoring force FR that increases with the deflection from the middle position M can be at least partially, optionally completely, compensated.

It may be provided that the magnet arrangement is designed and/or positioned such that the shaft 9 does not contact the magnet arrangement in its position deflected to the maximum from the middle position M. Accordingly, the ring magnet 17 according to FIGS. 6 and 7 can have a sufficiently large inside diameter and can be arranged at a suitable height position along the longitudinal axis of the shaft 9.

The ring magnet 17 may be arranged in the middle third of the shaft 9. The ring magnet 17 may also be designed to be height-adjustable in order to calibrate the magnetically generated compensation force $F_K$ correspondingly.

Figure 8:
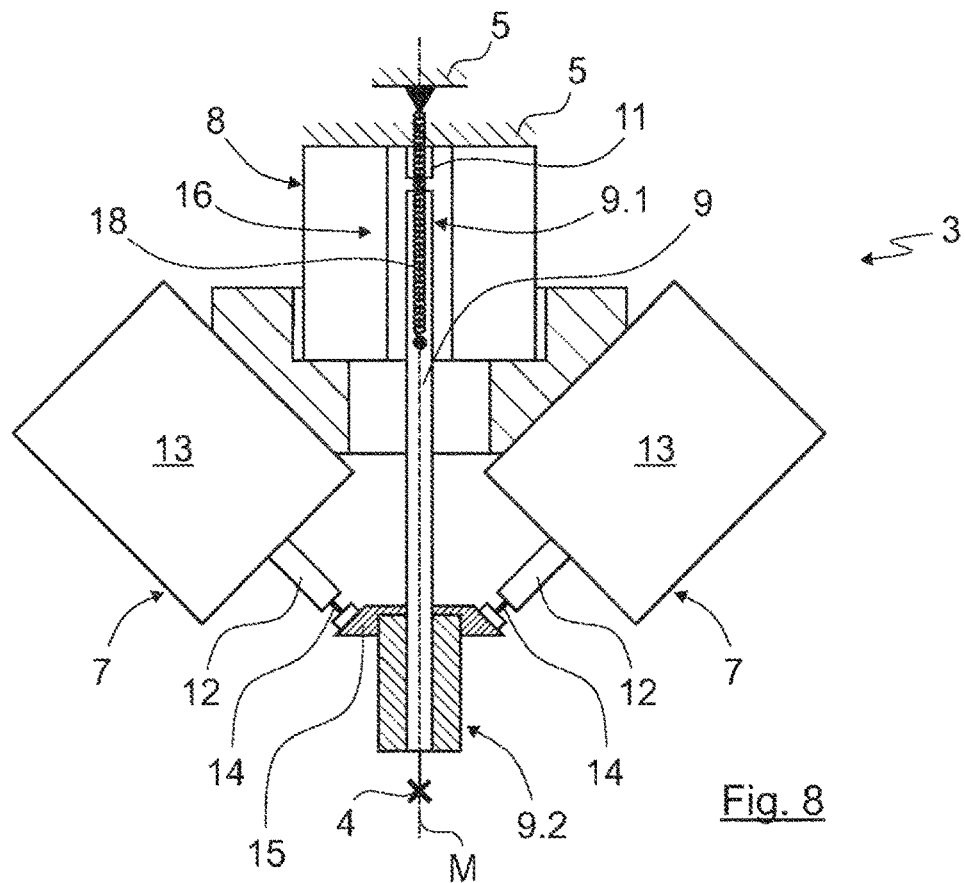
FIG. 8 schematically shows an actuator device, with a compensation device designed as a spring arrangement, a tension spring being provided in order to generate the compensation force.
Figure 9:
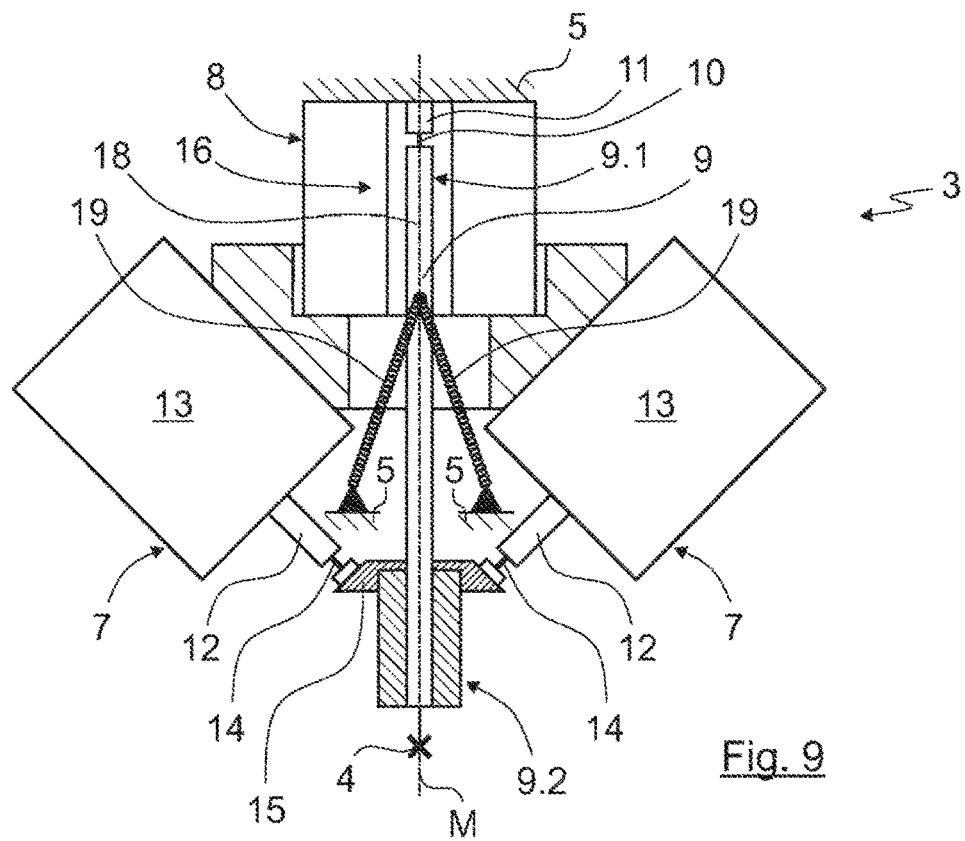
FIG. 9 schematically shows an actuator device, with a compensation device designed as a spring arrangement, two compression springs being provided in order to generate the compensation force.

FIGS. 8 and 9 show further embodiments of the actuator device 3 in which the compensation device 16 has a spring arrangement in order to generate the compensation force. The other features correspond in this case to the features already described in connection with FIGS. 6 and 7.

The spring arrangement in FIG. 8 has a tension spring 18 (generally a number of tension springs can also be provided), the tension spring 18 being fixed with a first end on the supporting structure 5 and with a second end on the shaft 9. The tension spring 18 in this case runs over the joint 10 and is pretensioned in the middle position M of the shaft 9.

If the shaft 9 is then deflected starting from its middle position M, the tension spring 18 can reduce its extended length. Since it tends toward this state, when the shaft 9 is deflected from the middle position M it finally generates a corresponding compensation force $F_K$.

The tension spring 18 may be aligned radially in relation to the shaft 9, for example run within the shaft 9 or be arranged around the shaft 9.

The spring arrangement according to FIG. 9 has two compression springs 19, the compression springs 19 being fixed with a respective first end on the supporting structure 5 and with a respective second end on a common fastening point on the shaft 9. The two compression springs 19 are pretensioned and form a triangle between the fastening points of the first ends on the supporting structure 5 and the common fastening point of the second ends on the shaft 9.

FIG. 9 shows the actuator device 3 with a shaft 9 located in the middle position M. As soon as the shaft 9 is deflected from its neutral middle position M in any direction, this movement is supported by the spring force, since the compression springs 19 initiate a common spring force in the axial direction upward along the central axis M and consequently introduce a torque into the shaft. As a result, a compensation force $F_K$ according to the disclosure can be generated.

Since the compensation force $F_K$ is generated purely mechanically in the embodiments shown in FIGS. 8 and 9, no additional magnetic or electromagnetic interference fields occur.

What is claimed is:

1. An actuator device, comprising:
   a shaft comprising first and second end portions, the first end portion being deflectably suspendable via a joint from a base point of a supporting structure, and the second end portion being fixable to an optical element;
   an actuator unit comprising a translator and a stator, the translator being fixed on the shaft, and the stator being mechanically connectable to the supporting structure to apply a deflection force to the shaft to radially deflect the shaft from a middle position; and
   a compensation device configured to apply to the shaft, independently of the deflection force, a compensation force to: i) increase in accordance with the deflection of the shaft from the middle position; and ii) counteract a restoring force acting on the shaft in the direction of the middle position caused by a weight of the optical element.

2. The actuator device of claim 1, further comprising a weight compensation device which comprises a translator, wherein:
   the translator of the weight compensation device is different from the translator of the actuator unit;
   the shaft is the translator of the weight compensation device, or the shaft is connected to the translator of the weight compensation device; and
   the weight compensation device is configured to at least partially compensate the weight of the optical element.

3. The actuator device of claim 1, wherein the joint comprises a flexure.

4. The actuator device of claim 1, wherein the actuator unit is fixed with the translator in an area of the second end portion of the shaft.

5. The actuator device of claim 1, further comprising an additional actuator unit which comprises a translator and a stator, wherein:
   the translator of the additional actuator unit is fixed on the shaft;
   the stator of the additional actuator unit is mechanically connectable to the supporting structure to apply a deflection force to the shaft to radially deflect the shaft from the middle position; and
   the two actuator units are fixed with their respective translator on opposite sides of the shaft.

6. The actuator device of claim 1, wherein the compensation device comprises a magnet arrangement configured to generate the compensation force.

7. The actuator device of claim 6, wherein the magnet arrangement comprises a ring magnet around the shaft.

8. The actuator device of claim 6, wherein the magnet arrangement is configured so that the shaft does not contact the magnet arrangement when maximally deflected from the middle position.

9. The actuator device of claim 1, wherein the compensation device comprises a spring arrangement configured to generate the compensation force.

10. The actuator device of claim 9, wherein:
    the spring arrangement comprises a tension spring;
    a first end of the tension spring is fixed on the supporting structure;
    a second end of the tension spring is fixed on the shaft;
    the tension spring is stretched beyond its relaxed length when the shaft is in the middle position.

11. The actuator device of claim 9, wherein:
    the spring arrangement comprises a compression spring;
    a first end of the compression spring is fixed on the supporting structure;
    a second end of the compression spring is fixed on the shaft; and
    the compression spring is compressed with respect to its relaxed length when the shaft is in the middle position.

12. The actuator device of claim 1, wherein the compensation device is configured to at least partially compensate or overcompensate for the restoring force acting on the shaft via the compensation force.

13. An optical assembly, comprising:
three actuator devices according to claim 1,
wherein each actuator device is configured to a common optical element.

14. An apparatus, comprising:
an illumination system which comprises a radiation source and an optical unit,
wherein:
   the optical unit comprises an optical element and actuator according to claim 1;
   the optical element being alignable, mountable, adjustable, manipulable and/or deformable via the actuator device; and
   the apparatus is a semiconductor lithography projection exposure apparatus.

15. The apparatus of claim 14, wherein the apparatus is an EUV semiconductor lithography projection exposure apparatus.

16. A method, comprising:
using an actuator unit to apply a deflection force via a translator to a shaft, a first end portion of the shaft being deflectably suspended via a joint from a base point of a supporting structure, a second end portion of the shaft being fixed on an optical element of a projection exposure apparatus to radially deflect the shaft from a middle position; and
using a compensation device to apply to the shaft, independently of the deflection force, a compensation force to: i) counteract a restoring force acting on the shaft in a direction of the middle position caused by a weight of the optical element; and ii) increase in accordance with the deflection of the shaft from the middle position.

17. An optical assembly, comprising:
an optical element;
a joint;
a supporting structure comprising a base point;
an actuator device, comprising:
   a shaft comprising first and second end portions, the first end portion being deflectably suspendable via the joint from the base point of the supporting structure, and the second end portion being fixable to the optical element;
   an actuator unit comprising a translator and a stator, the translator being fixed on the shaft, and the stator being mechanically connectable to the supporting structure to apply a deflection force to the shaft to radially deflect the shaft from a middle position; and
   a compensation device configured to apply to the shaft, independently of the deflection force, a compensation force to: i) increase in accordance with the deflection of the shaft from the middle position; and ii) counteract a restoring force acting on the shaft in the direction of the middle position caused by a weight of the optical element.

18. The optical assembly of claim 17, wherein the optical element comprises a mirror.

19. The optical assembly of claim 17, wherein the compensation device comprises a magnet arrangement configured to generate the compensation force.

20. The optical assembly of claim 17, wherein the compensation device comprises a spring arrangement configured to generate the compensation force.

* * * * *

UNITED STATES PATENT AND TRADEMARK OFFICE
CERTIFICATE OF CORRECTION

PATENT NO. : 12,164,234 B2  
APPLICATION NO. : 17/458073  
DATED : December 10, 2024  
INVENTOR(S) : Boaz Pnini-Mittler Page 1 of 1

It is certified that error appears in the above-identified patent and that said Letters Patent is hereby corrected as shown below:

On the Title Page

Column 2, Item (57), Line 15, after "element" insert -- . --.

In the Specification

Column 1, Line 59, after "coil" delete "would".

Column 4, Line 67, delete "$20^{\circledR}$" insert -- 20° --.

Column 5, Line 47-50, delete "The magnetic body may likewise be a permanent magnet, but also any desired ferromagnetic material, for example a soft-magnetic material, on which a permanent magnet has a magnetically attractive effect." Insert same at Column 5, Line 46, as a continuation of the same paragraph.

Column 8, Line 30, after "also" insert -- be --.

Signed and Sealed this  
Eleventh Day of February, 2025

Coke Morgan Stewart  
*Acting Director of the United States Patent and Trademark Office*